US008565505B2

(12) United States Patent
Bergmans et al.

(10) Patent No.: US 8,565,505 B2
(45) Date of Patent: Oct. 22, 2013

(54) AUTOMATED SEQUENTIAL PLANNING OF MR SCANS

(75) Inventors: Cornelis Johannes Franciscus Maria Bergmans, Eindhoven (NL); Daniel Bystrov, Hamburg (DE); Harald Sepp Heese, Hamburg (DE); Marc Kouwenhoven, Eindhoven (NL); Johan Michiel Den Harder, Eindhoven (NL); Arjan Willem Simonetti, Eindhoven (NL); Wendy De Kok, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 196 days.

(21) Appl. No.: 13/126,274

(22) PCT Filed: Nov. 2, 2009

(86) PCT No.: PCT/IB2009/054848
§ 371 (c)(1),
(2), (4) Date: Apr. 27, 2011

(87) PCT Pub. No.: WO2010/052629
PCT Pub. Date: May 14, 2010

(65) Prior Publication Data
US 2011/0206260 A1 Aug. 25, 2011

(30) Foreign Application Priority Data

Nov. 5, 2008 (EP) ..................................... 08168342

(51) Int. Cl.
*G06K 9/00* (2006.01)
(52) U.S. Cl.
USPC .......... 382/131; 382/128; 382/173; 600/407; 600/410; 378/4; 378/8; 378/901
(58) Field of Classification Search
USPC ................. 382/128, 131, 173; 600/407, 410; 378/4, 8, 901
See application file for complete search history.

(56) References Cited

U.S. PATENT DOCUMENTS 5,320,102 A * 6/1994 Paul et al. ...................... 600/410
5,758,646 A * 6/1998 Van Der Meulen et al. .. 600/407
(Continued)

FOREIGN PATENT DOCUMENTS

EP 1362550 A1 11/2003
EP 1365253 A2 11/2003
(Continued)

OTHER PUBLICATIONS

Boudewijn P. F. Lelieveldt, Rob J. van der Geest, Hildo J. Lamb, Hein W. M. Kayser, Johan H. C. Reiber, "Automated Observer-independent Acquisition of Cardiac Short-Axis MR Images:A Pilot Study" 10.1148/radiol.2212010177, RSNA, 2001.*
(Continued)

*Primary Examiner* — Stephen R Koziol
*Assistant Examiner* — Shaghayegh Azima (57) ABSTRACT

A method of acquiring at least one clinical MRI image of a subject comprising the following steps: acquiring a first survey image with a first field of view, the first survey image having a first spatial resolution,—locating a first region of interest and at least one anatomical landmarks in the first survey image, determining the position and the orientation of the first region of interest using the anatomical landmarks, the position and the orientation of the first region being used for—planning a second survey image,—acquiring the second survey image with a second field of view, the second survey image having a second spatial resolution, the second spatial resolution being higher than the first spatial resolution, generating a geometry planning for the anatomical region of interest using the second survey image,—acquiring a diagnostic image of the anatomical region of interest using the geometry planning.

15 Claims, 4 Drawing Sheets

(56) References Cited

U.S. PATENT DOCUMENTS

| | | | | |
|---|---|---|---|---|
| 6,064,208 | A | * | 5/2000 | Steckner .................. 324/320 |
| 6,195,409 | B1 | | 2/2001 | Chang et al. |
| 6,396,266 | B1 | * | 5/2002 | Debbins et al. ............. 324/307 |
| 6,574,304 | B1 | * | 6/2003 | Hsieh et al. ................. 378/62 |
| 6,768,782 | B1 | | 7/2004 | Hsieh et al. |
| 2002/0025503 | A1 | * | 2/2002 | Chapoulaud et al. ........... 433/24 |
| 2003/0216337 | A1 | * | 11/2003 | Hallahan .................... 514/44 |
| 2004/0064037 | A1 | * | 4/2004 | Smith ...................... 600/420 |
| 2005/0001618 | A1 | * | 1/2005 | Bydder ..................... 324/307 |
| 2005/0165294 | A1 | | 7/2005 | Weiss |
| 2005/0165295 | A1 | * | 7/2005 | Li et al. ................... 600/410 |
| 2006/0155583 | A1 | * | 7/2006 | Teshima et al. ............... 705/3 |
| 2006/0159342 | A1 | * | 7/2006 | Sun et al. .................. 382/173 |
| 2006/0164653 | A1 | * | 7/2006 | Everett et al. ............... 356/479 |
| 2006/0274928 | A1 | * | 12/2006 | Collins et al. .............. 382/132 |
| 2007/0036413 | A1 | * | 2/2007 | Beck et al. ................. 382/128 |
| 2007/0081712 | A1 | * | 4/2007 | Huang et al. ................ 382/128 |
| 2008/0071163 | A1 | | 3/2008 | Zhang et al. |
| 2008/0146910 | A1 | * | 6/2008 | Parrish et al. .............. 600/410 |
| 2010/0189328 | A1 | * | 7/2010 | Boernert et al. ............. 382/131 |
| 2010/0312734 | A1 | * | 12/2010 | Widrow ..................... 706/25 |
| 2011/0229005 | A1 | * | 9/2011 | Den Harder et al. .......... 382/131 |
| 2012/0123577 | A1 | * | 5/2012 | Chapoulaud et al. ........... 700/98 |
| 2012/0140175 | A1 | * | 6/2012 | Everett et al. .............. 351/206 |

FOREIGN PATENT DOCUMENTS

| | | |
|---|---|---|
| EP | 1645044 A1 | 1/2006 |
| WO | 2005088328 A2 | 9/2005 |
| WO | 2005088520 A1 | 9/2005 |

OTHER PUBLICATIONS

Laurent Itti, Linda Chang, and Thomas Ernst, "Automatic Scan Prescription for Brain MRI", Magnetic Resonance in Medicine 45:486-494 (2001.*

Paul A. Yushkevich, Joseph Piven, Heather Cody Hazlett, Rachel Gimbel Smith, Sean Ho, James C. Gee, Guido Gerig, User-guided 3D active contour segmentation of anatomical structures: Significantly improved efficiency and reliability, NeuroImage, vol. 31, Issue 3, Jul. 1, 2006, pp. 1116-1128, ISSN 1053-8119, 10.1016/j.neuroimage.2006.01.015.*

Young et al: "Automated Planning of MRI Neuro Scans"; Proceedings of SPIE, vol. 6144, Mar. 2006, pp. 6144M-1-6144M-8.

Jackson et al: "Automatic Planning of the Acquisition of Cardiac MR Images", Lecture Notes in Computer Science, vol. 2878, 2003, pp. 541-548.

Lelieveldt et al: "Automated Observer-Independent Acquisition of Cardiac Short-Axis MR Images: A Pilot Study"; Radiology, vol. 221, No. 2, Nov. 2001, pp. 537-542.

Itti et al: "Automatic Scan Prescription for Brain MRI"; Magnetic Resonance in Medicine, vol. 45, 2001-, pp. 486-494.

Violas et al: "Objective Quantification of Intervertebral Disc Volume Properties Using MRI in Idiopathic Scoliosis Surgery"; Magnetic Resonance Imaging, vol. 25, 2007, pp. 386-391.

Bornert et al: "Whole-Body 3D Water/Fat Resolved Continuously Moving Table Imaging"; Journal of Magnetic Resonance Imaging, vol. 25, 2007, pp. 660-665.

Aldefeld et al: "Continuously Moving Table 3D MRI With Lateral Frequency-Encoding Direction"; Magnetic Resonance in Medicine, vol. 55, 2006, pp. 1210-1216.

Heese et al: "Robust Anatomy Recognition Approach for Automated Scan Planning of Spine MRI Examinations"; Proc. Intl. Soc. Mag. Reson. Med., vol. 16, 2008, p. 3171.

Dries et al: "MR Travel to Scan Image Processing for Real-Time Liver Identification"; Proc. Intl. Soc. Mag. Reson. Med., vol. 16, 2008, p. 3170.

Urban et al: "Pathophysiology of the Intervertebral Disc and the Challenges for MRI"; Journal of Magnetic Resonance Imaging, vol. 25, 2007, pp. 419-432.

Morgan et al:"MRI of the Lumbar Intervertebral Disc"; Clinical Radiology, vol. 54, 1999, pp. 703-723.

Weese et al: "Shape Constrained Deformable Models for 3D Medical Image Segmentation"; LNCS 2082, 2001, pp. 380-387.

* cited by examiner

AUTOMATED SEQUENTIAL PLANNING OF MR SCANS

FIELD OF THE INVENTION

The invention relates to a method, an apparatus, and a computer program product for automatically acquiring clinical MRI image data.

BACKGROUND OF THE INVENTION

A large static magnetic field is used by MRI scanners to align the nuclear spins of atoms as part of the procedure for producing images within the body of a patient. This large static magnetic field is referred to as the B0 field.

During an MRI scan, Radio Frequency (RF) pulses generated by a transmitter coil cause perturbations to the local magnetic field, and RF signals emitted by the nuclear spins are detected by a receiver coil. These RF signals are used to construct the MRI images. These coils can also be referred to as antennas. Further, the transmitter and receiver coils can also be integrated into a single transceiver coil that performs both functions. It is understood that the use of the term transceiver coil also refers to systems where separate transmitter and receiver coils are used. The transmitted RF field is referred to as the B1 field.

MRI scanners are able to construct images of either slices or volumes. A slice is a thin volume that is only one voxel thick. A voxel is a small volume over which the MRI signal is averaged, and represents the resolution of the MRI image. The term volume will be understood to refer to both slices and volumes.

When an MRI examination is performed, the MRI images that are constructed are temporally dependent. If an examination is performed on a region of the body which is moving, such as on the heart or an organ in the vicinity of the diaphragm, time dependent images need to be taken and correlated to the heart beat and the breathing cycle. Standard techniques in the art exist compensating for this motion. The anatomy of certain organs and portion of the body can also be challenging to image properly. For example, the heart and the knee require highly trained and high skilled operators to produce clinical MRI images which are useful for diagnosis.

For example, during an MRI examination of the heart the location and the orientation of the slices produced relative to the anatomy of the heart is critical for the specific diagnosis. To perform a MRI examination of this type, an operator would perform a series of scans. First, the operator images multiple slices of the patient's body to determine the rough orientation of the patient's anatomy. Using these rough images, the operator would manually locate the diaphragm and the heart. At a minimum a stack of slices would be orientated by the operator. In practice, navigator beam, a shim volume or other elements need to be orientated, which makes this a time consuming operation. The stack of slices defines the orientation, field of view and the series of slices with all their parameters which are used in the next scan. The navigator beam is a thin volume that is imaged to correlate the position of the diaphragm and compensate for the patient's breathing. The shim volume is a volume from which information is used to compensate for local fluctuations in the B0 field.

After these volumes are determined, a second series of images resolved for the phase of the patient's breathing and heart are acquired. This new set of MRI images is then used by the operator to examine the anatomy of the heart in greater detail and manually define, depending on the suspected disorder, the slices or volumes which will be imaged for clinical diagnosis by a physician. Images which are intended for the purpose of determining a diagnosis are referred to as clinical MRI images.

For the heart, setting the position and orientation of the stack of slices used to acquire the clinical MRI images will greatly depend upon the indication of the patient. For example, the visualization needed to properly diagnose congenital heart disease can be quite different from ischemic heart disease. To be able to properly set up the MRI system to image the correct MRI images, the operator will need a large amount of training, experience, and an ability to visualize three dimensional (3D) structures from two dimensional (2D) projections or slices on a computer monitor. The difficulty with this is that the clinical images obtained by different operators will have differing levels of quality. In addition, reproducibility of a clinical MRI image, e.g., in a follow up procedures, is difficult to achieve when setting the position and orientation of the stack of slices is performed manually. When an operator produces clinical images of poor quality, they will need to be redone. This is of course expensive for hospitals, and raises the cost of having MRI examination done on a patient. US patent application 2005/0165294 teaches the use of a three-step procedure to correct for the positioning of patients during medical scans.

SUMMARY OF THE INVENTION

The invention provides for a method of acquiring MRI image data, a computer program product, and an apparatus for acquiring MRI image data as claimed in the independent claims. Embodiments of the invention are given in the dependent claims.

The Field Of View (FOV) is defined herein as meaning the volume for which an MRI image is constructed. The MRI data used to construct an MRI image is radio signals that are collected in the frequency domain. It is therefore important to note that the MRI data is converted into an image using a Fourier integral, and as a result tissues outside of the FOV contribute to the image.

Embodiments of the invention provide a method and apparatus for automated scan planning. These embodiments are particularly advantageous as automated planning of patient specific geometries at MRI scanner consoles eliminates operator errors, reduces the training requirements for operators, and saves time during MRI examinations. Another advantage of automated scan planning is the avoidance of inter- and intra-operator variability.

Automated sequential scan planning has advantages over a single survey scan. For some anatomies, an automated sequential scan is more rapid than a single survey scan. Sequential survey scans also contain more information than a single survey scan and allow for the accurate and consistent planning of diagnostic scans. Images which are intended for the purpose of determining a diagnosis are defined herein as clinical MRI images. A survey or survey scan is defined herein as an MRI image that is used for planning a clinical MRI image.

Embodiments of the invention relate to a method of acquiring at least one clinical MRI image of a subject. An MRI image is defined as a graphical representation of MRI data. MRI data is any data acquired by an MRI scanner. A clinical MRI image is an MRI image for use by a physician for diagnosing a patient.

In accordance with embodiments of the invention a multiple 2D MRI image of the subject using a preselected parameter set is acquired. A 2D MRI image is a collection of slices which give an overview of the subject's anatomy. 2D MRI images are normally anisotropic. For example, the typical voxel dimensions used for the sagittal slices during the construction of a 2D MRI image used during a cardiac MRI examination is 1.7 mm by 1.75 mm by 10 mm. The slice spacing can be even greater than the voxel size. For these sagittal slices, the slice thickness is 10 mm. The distance between the voxel centers is 15 mm. Therefore, there is a 5 mm gap between the slices in this case. The number of volumes, number of slices in each volume, slice thickness, slice distance, and the resolution within a slice that are used to construct the 2D MRI image will depend on the protocol chosen.

Initially, the orientation of the patient's anatomy is not known. The patient is positioned within the MRI scanner so that a pre-determined set of slices will define the patient's internal anatomy. This can be accomplished by acquiring a predetermined number of axial, coronal, and sagittal slices with a predetermined orientation. The number, position, and exact orientation of these slices are predetermined by the MRI protocol chosen. The 2D MRI image is used to construct a three-dimensional (3D) volume constructed of voxels. If all sides of these voxels are identical, then the volume is isotropic. The volume does not need to be isotropic, but an isotropic volume makes it easier to apply an edge detector to. The value of the individual voxels is calculated by linearly interpolating the value from the voxels of the 2D MRI image.

The edges in the 3D volume are detected with an edge detection module. This can be accomplished with a suitable edge detection algorithm such as the Sobel operator. Other alternatives include algorithms based upon: the Canny edge detector, the differential edge detector, the Marr-Hildreth operator, the phase congruency based edge detector, the Laplace operator, the Deriche edge detector, the Rothwell edge detector, the Prewitt operator, the Kirsch operator, the Hueckel operator, and the Roberts operator. The Sobel operator operates in specific planes of the 3D volume. The Sobel operator can be applied to voxels that all lie in the same plane. The Sobel operator can also be applied to planes that do not lie within a plane of voxels. In this case, the voxels are weighted by according to how much of the voxel is intersected by the plane. Anatomical landmarks are then identified using an anatomical landmark module using the set of edges. The 3D volume is the segmented using a first shape constrained deformable model using a first segmentation module. Shape constrained deformable models are discussed in Weese et al., "Shape constrained Deformable Models for 3D Medical Image Segmentation," Lecture Notes In Computer Science Vol. 2082, 2001, pp. 380-387 (cited as Weese) which is included herein by reference. A shape constrained deformable model is a three dimensional model of the patient's anatomy, which is deformed by the segmentation module to fit feature points. As the shape constrained deformable model is iteratively deformed to fit feature points, which are calculated using both the model and image data. Feature points can be extracted from an image using a feature detection algorithm. The model calculates the stress and strain on the surface of the model as well as the internal forces caused by the deformation.

A volume of interest within the 3D volume is then determined with a first pattern recognition module. The volume of interest is a region for which MRI data is acquired. The MRI data is constructed from data in Fourier space. As a result regions outside the physical boundaries of the volume of interest contribute to the MRI image. One or more preliminary MRI images are then acquired for the volume of interest. The preliminary MRI images are then segmented using a second shape constrained deformable model using a second segmentation module. A second pattern recognition module is then used to plan the clinical MRI images. Finally, one or more clinical MRI images are acquired.

In another embodiment, the MRI data acquired during the acquisition of the clinical MRI image can be stored in a computer storage device for later reuse. The MRI data that can be stored is comprised of: the multiple 2D image, the 3D volume, the set of edges, the one or more anatomical landmarks, the segmented 3D volume, the volume of interest, the one or more preliminary MRI images, and the one or more preliminary segmented MRI images. This MRI data can later be retrieved from the computer storage device and reused for generating a second set of planning data for planning a clinical MRI image. This has the advantage that a second clinical MRI image can be planned without the need for repeating the entire method. For instance, the multiple 2D image or the 3D volume can be reused. This would reduce the time needed to acquire a second clinical MRI image.

In another embodiment the first pattern recognition module can determine multiple volumes of interest. This is a benefit, because the tissue surrounding a volume being imaged also affects the acquired MRI. The multiple volumes can be overlapping, not overlapping, and can cover an identical volume. The first pattern recognition module selects each volume to be in a first subset, a second subset, or a third subset. Elements of the first and the third subset are imaged one or more times by the MRI scanner. Elements of the second subset and the third subset has an MRI technique applied to it selected from the group of consisting of: magnetization preparation pulses, fat suppression pulses, Arterial Spin Labeling (ASL), Regional Saturation Technique (REST), Spectral Presaturation Inversion Recovery (SPIR), Inversion, Navigator beam, B1 shimming, and B0 shimming. Tissues outside the volume being imaged for a clinical MRI image can affect the image quality. Applying these techniques has the benefit of improving the image quality. The MRI data acquired by from all of these volumes of interest is used for generating the planning data. A benefit of using all acquired MRI data is that anatomy and the position of the anatomy is known in greater detail.

In another embodiment the first pattern recognition module is a trained pattern recognition module. This has the advantage that the pattern recognition module can be trained using a set of training images, where the volume or volumes of interest have been correctly placed. This could be implemented by using a variety of different methods. Examples of different methods or algorithms that could be used are: Principal Component Analysis, Neural Network, CN2 algorithm, C4.5 algorithm, Iterative Dichotomiser 3 (ID3), nearest neighbor search algorithm, naive Bayes classifier algorithm, Holographic Associative Memory, or perception learning algorithm.

In another embodiment the second pattern recognition is a trained pattern recognition module. This would have the same advantage as implementing the first trained pattern recognition module as a trained pattern recognition module. The second pattern recognition module can be implemented using the same choice of algorithms and methods as the first pattern recognition module. If the same algorithm or method were used to implement the first and the second pattern recognition modules, they would still be distinct pattern recognition modules. This is because they will have undergone different training. The first pattern recognition module and the second pattern recognition module can be trained by the manufacturer of the MRI system and delivered to the operator for use.

In another embodiment, the anatomical recognition module can be an implementation of a feature identification algorithm. This feature identification algorithm can be an algorithm such as the Hough Transform or the Scale-Invariant Feature Transform (SIFT). These algorithms have the advantage of being able to identify complex geometry. The feature identification algorithm can also be a custom algorithm which is based upon prior knowledge of the anatomy. For instance the diaphragm is easily identifiable in a MRI image. An edge detection algorithm will locate the border of the diaphragm, and a connected component analysis will produce a surface which can be identified and used by the first segmentation module.

In another aspect, a computer program product comprising a set of computer executable instructions can be used for automating embodiments of the invention. This is an advantage because a computer or microprocessor can perform the calculations much more rapidly than a human operator.

In another aspect, an embodiment of an apparatus as described in independent claim 7 can be used for acquiring clinical MRI data.

In another embodiment, embodiments of the apparatus will have a means for storing previously acquired MRI data for the purpose of planning new clinical MRI images.

In another embodiment, embodiments of the apparatus will implement the first pattern recognition module and/or the second pattern recognition module as trained pattern recognition modules.

In another embodiment, the embodiment of the first pattern recognition module is operable to determine multiple volumes of interest.

In another embodiment, embodiments of the apparatus have a user interface which is operable to display the set of planning data graphically before the clinical MRI scan is acquired. This has the advantage that the user is able to control the quality of the clinical MRI images. After the images are displayed, the operator would have a choice of accepting or rejecting the planning data. If the operator accepts the planning data, the MRI system would proceed with acquiring the MRI data and constructing the MRI images. If the operator rejects the planning data, the operator would have the choice of having the embodiment of the apparatus restart the process and generate a new set of planning data or to manually edit the planning data. The operator would have a choice of examining a set of rejection data that is comprised of: the multiple 2D image, the 3D volume, the edges, the anatomical landmarks, the segmented 3D volume, the volume of interest, the one or more preliminary MRI images, and the one or more preliminary segmented MRI images and the set of planning data. This has the advantage that the operator is able to examine all of the MRI data and planning data.

In another embodiment, an embodiment of the user interface is operable to receive a manual modification of the set of rejection data. This has the advantage that the operator can modify any errors which may be made by the apparatus. The modified rejection data is then used for generating a modified set of planning data. This has the advantage that the apparatus does not need to repeat the entire method, which saves time.

BRIEF DESCRIPTION OF THE DRAWINGS

In the following preferred embodiments of the invention will be described, by way of example only, and with reference to the drawings in which.

DETAILED DESCRIPTION

Figure 1:
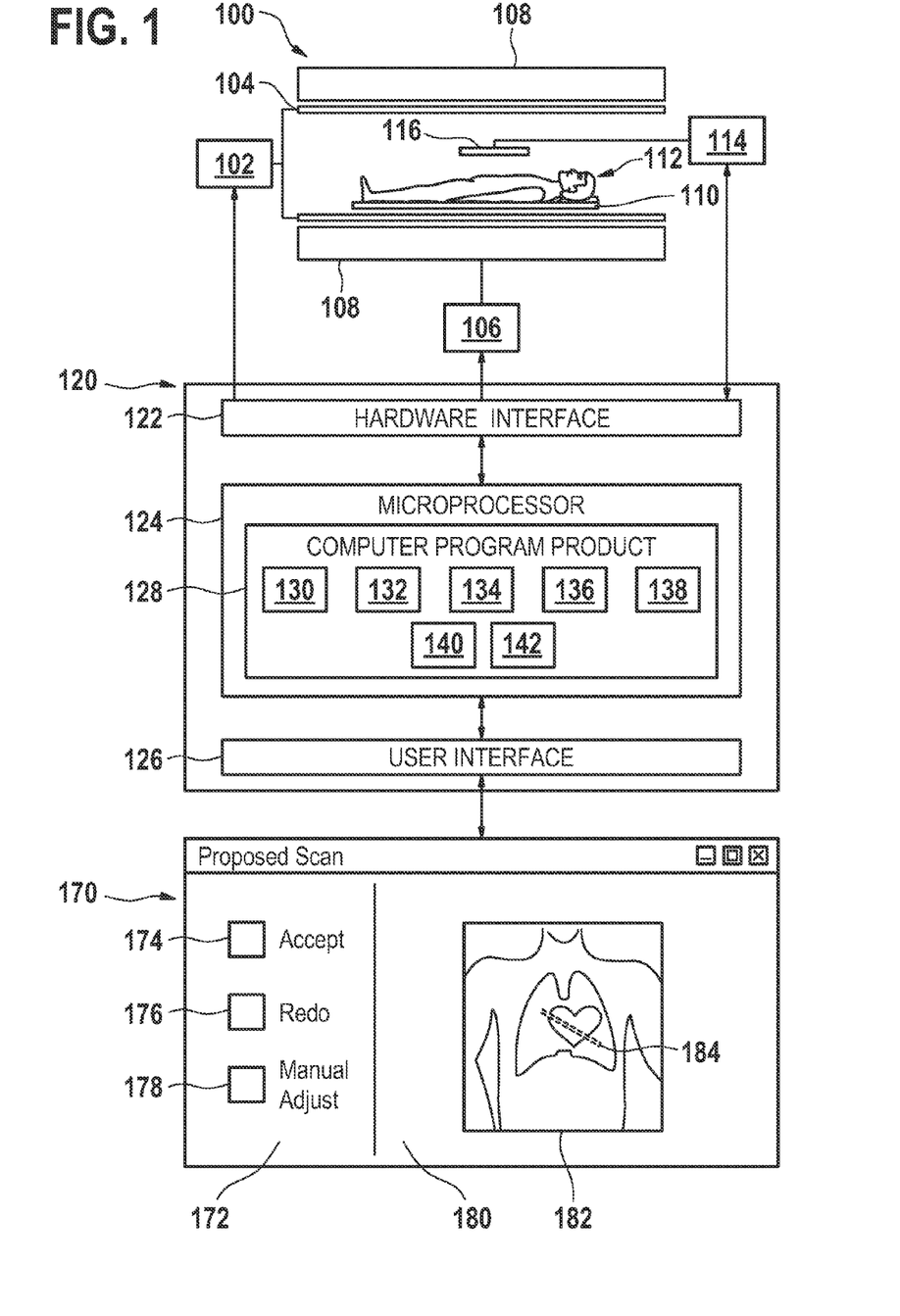
FIG. 1 is a functional schematic of an embodiment of an MRI system capable of the automated planning and acquisition of MRI images.

FIG. 1 shows an embodiment of an MRI scanner 100 capable of performing embodiments of the invention. There is a static magnet 108 which produces a large magnetic field, also known as B0, which is capable of causing the nuclear spins within a patient 112 or other object to align with the B0 field. The patient 112 rests within the bore of the magnet on a support 110. Gradient coils 104 are also located within the bore of the magnet and are able to adjust the magnetic field. Adjacent to the volume of the patient 112 which is to be imaged is a transceiver coil 116. This coil transmits and receives RF signals. In the transmit mode, the coil generates an RF signal which produces local perturbations of the magnetic field which are used to manipulate the orientation of the nuclear spins within the patient 112. In the receive mode the phased array transceiver coil 116 receives the RF signal caused by the precession of the nuclear spins in the B0 field. The function of the transceiver coil is very commonly divided into separate transmitter and receiver coils. The term transceiver coil as used here is intended to refer to both possibilities. The exact design of the coil or coils depends upon the type of MRI examination to be performed.

The gradient coils 104 are connected to a gradient coil control unit 102. The gradient coil control unit 102 incorporates a controllable current source. When the gradient coils are energized, the current through them causes a perturbation of the magnetic field within the bore of the magnet. This perturbation of the field can be used to either make the B0 field more uniform, or to purposely cause gradients in the magnetic field. An example would be using a magnetic field gradient to cause the spatial encoding of the frequency at which the nuclear spins process in the B0 field. The magnet is connected to a magnet control unit 106. The magnet control unit is for controlling and monitoring the status of the magnet.

The transceiver coil 116 is connected to a RF transceiver coil control unit. This control unit incorporates an RF generator or generators capable of controlling the phase and amplitude of the RF signal applied to the transceiver coil.

The gradient control unit 102, the magnet control unit 106, and the transceiver coil control unit 114 are all connected to the hardware interface 122 of a control system 120. This control system controls the function of MRI scanner 100. The control system 120 is comprised of a hardware interface 122 and a user interface 126 connected to a microprocessor 124. An embodiment of the invention would be where the microprocessor 124 is a computer system. The hardware interface 122 allows the microprocessor 124 to send commands to and receive information from the gradient control unit 102, the magnet control unit 106, and the RF transceiver control unit 114. The user interface 126 allows the operator to control the function of the MRI system, and is able to display MRI images. A computer program product 128 is used by the microprocessor to automate the control of the MRI system 100 and the analysis of the MRI data to construct MRI images. The computer program product is comprised of software modules: a 3D volume module 130, an edge detection module 132, an anatomical landmark module 134, a first segmentation module 136, and a second segmentation module 138.

The user interface 126 has a dialogue box 170 that is operable to allow the operator to review the planning data graphically. This dialogue box 170 is comprised of a region to display the planning data graphically 180 and a region 172 which allows the operator to approve the planning data or to reject the planning data. The region for displaying the planning data 180 is operable to display MRI images 182 and MRI planning data 184 graphically. The region for approving or rejecting the planning data 172 is comprised of several buttons. One button 124 accepts the planning data. Embodiments of the apparatus then proceed with acquiring the clinical MRI images. Another button 176 has the apparatus repeat the planning process and suggest a new set of planning data. A third button 178 allows the operator manually adjust the planning data and being able to adjust the volume or volumes of interest.

Figure 2:
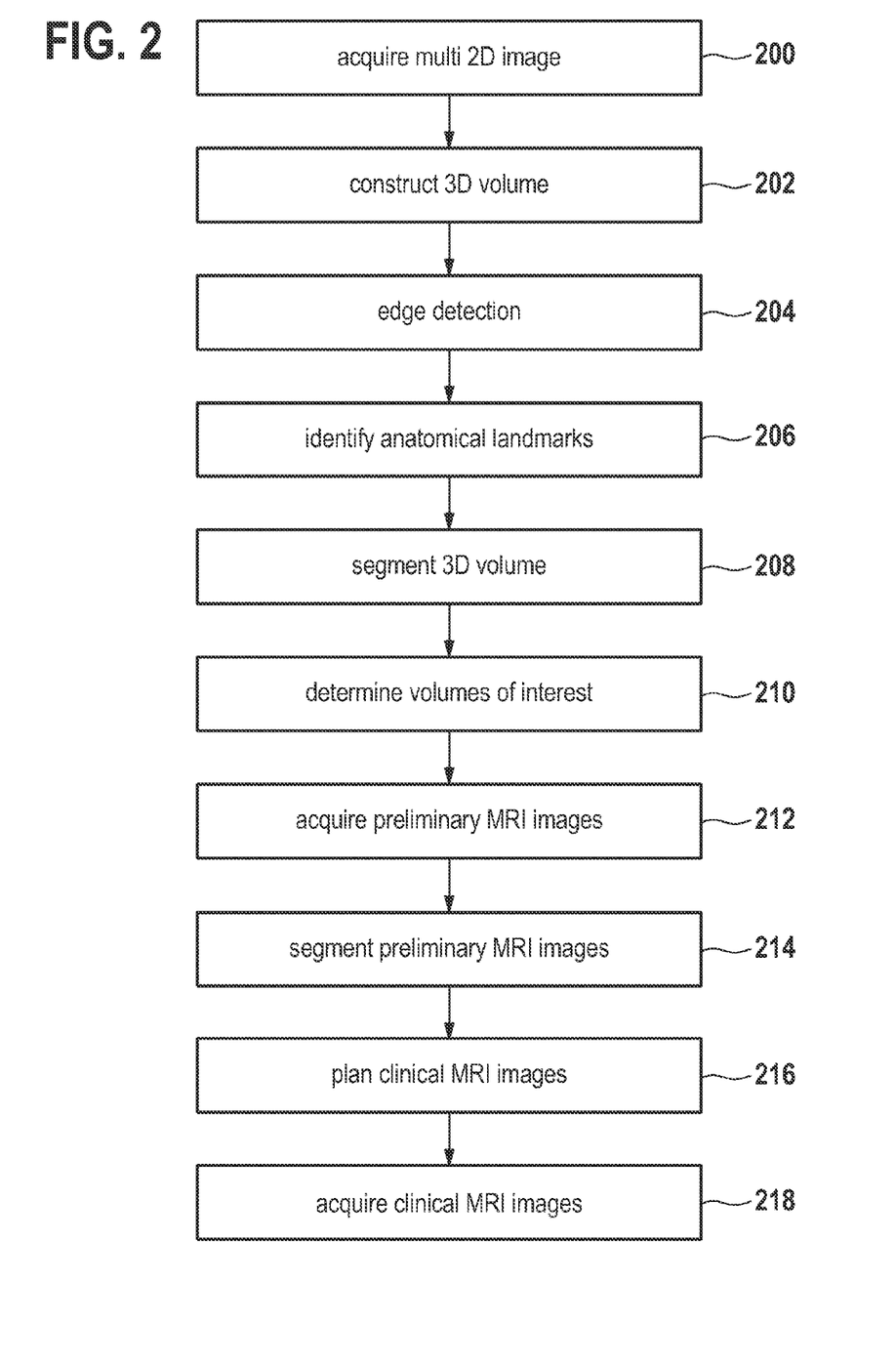
FIG. 2 is a block diagram showing an embodiment of the method of the invention.

FIG. 2 shows an embodiment of the method of performing the invention. First a multi 2D image is acquired 200. The multi 2D image consists of stacks of slices in the axial, sagittal, and coronal plane. For a cardiac MRI examination, the multiple 2D image consists of 20 axial slices, 20 coronal slices, and 20 sagittal slices. Using linear interpolation, the multiple 2D image is used to construct a 3D volume 202. An edge detection algorithm is then used to detect edges in the 3D volume 204. The Sobel operator is applied along each of the coordinate axes of the 3D volume. In other words the Sobel operator is applied in the x, y, and z directions, where the coordinate axes of the 3D volume are labeled x, y, and z. Ideally the x, y and z axes will be aligned with the axes of the MRI scanner. The application of the Sobel operator in each of these direction yields a 3D gradient vector.

The Sobel operator is effective for detecting edges and is not computational intensive. The Sobel operator can detect edges in particular planes. The edges in different planes are connected together using clustering. That is the edges are located using connected component analysis. The connected component analysis identifies interfaces with the patient's anatomy and identifies anatomical landmarks 206. This works by defining a neighborhood around each voxel that passes the threshold responses of the Sobel filter. A neighborhood is defined as a region of adjacent voxels within a certain distance of the voxel that passed the threshold responses. Clusters are formed by groups of interconnected neighborhoods. Each cluster is then rated according to its size and location within the 3D volume. The highest rated cluster is then identified as being an anatomical edge. An anatomical edge is a surface which defines the location or boundary of an anatomical feature. Examples of anatomical edges are the diaphragm, the right wall of the pericardium, or the left wall of the pericardium. A set of anatomical landmarks are then derived from the anatomical features that have been identified. These anatomical landmarks are identified from cluster characteristics such as the center, the eccentricity, the bounding box, global extremes, and local extremes. These anatomical landmarks are used primarily for the initial placement of the shape constrained deformable models.

After the initial placement of the shape constrained deformable model, the 3D volume is segmented 208. Segmenting is defined to be dividing the volume into different segments which represent features of the patient's anatomy. The segmentation module fits a shape constrained deformable model to a set of feature points. Feature points are calculated using both the model and image data using a feature detection algorithm. Corresponding points on the model are iteratively fit to the features points. After the segmentation module has adjusted the location of the meshes, a second set of landmarks are extracted from the mesh and/or model. The pattern recognition module then uses the second set of anatomical landmarks to execute the planning. The initial set of anatomical landmarks can also be used by the pattern recognition module. The connected component analysis identifies the initial location of 3D meshes within the 3D volume. The segmentation module then adjusts the location of the 3D meshes. A second and set of anatomical landmarks are extracted from the combination of the mesh and/or the model. Various volumes of interest are determined by a first pattern recognition module 210 using the second set of anatomical landmarks.

The first pattern recognition module can be implemented as a trainable module. The module is trained using training images. After the volumes of interest are determined, preliminary MRI images are acquired 212 in the volume of interest. In many cases more than one volume of interest will be determined, and these additional volumes will either be imaged also or one of a variety of MRI techniques, which has already been described, will be applied to it. The preliminary MRI images are then segmented using a second segmentation module 214. Anatomical landmarks are extracted from the three dimensional meshes that result from the segmentation. These anatomical landmarks are then used by a second pattern recognition module 216 to plan the clinical MRI image. Finally, the clinical MRI images are acquired 218.

Figure 3:
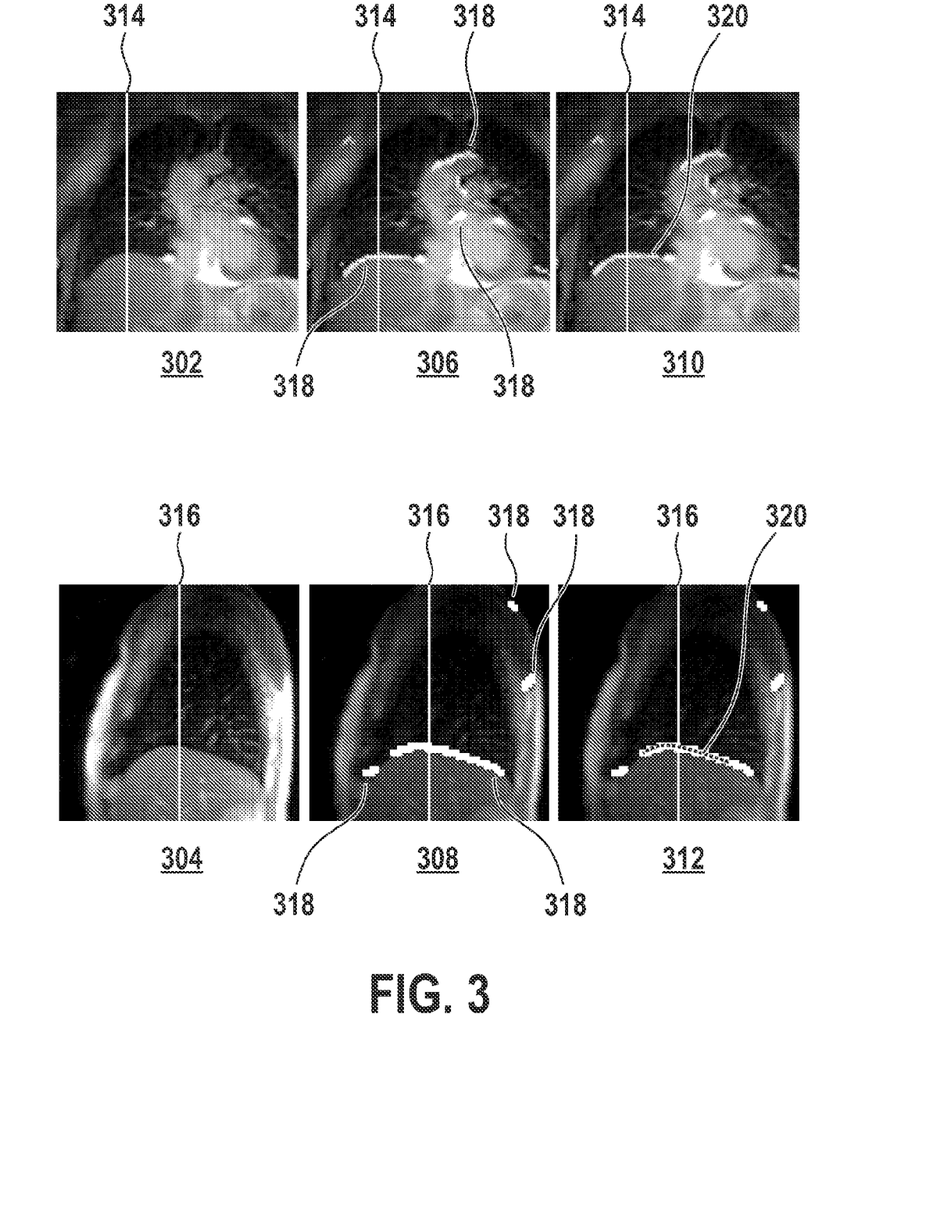
FIG. 3 is a series of coronal and sagittal MRI images which demonstrate an embodiment of the method of automatically detecting the diaphragm.

FIG. 3 shows two groups of images 302, 304, 306, 308, 310, 312.

The top row of images 302, 306, 310 show a coronal plane going through the heart. The heart resting on the diaphragm is visible in the top row of images 302, 306, 310. The vertical line 314 shown in the top row of images 302, 306, 310 shows the position of the sagittal slice shown in bottom row of images 304, 308, 312. The bottom row of images 304, 308, 312 shows a median sagittal slice showing the diaphragm. The diaphragm and the lungs are visible in these images. The vertical line 316 in the bottom row of images 304, 308, 312 shows the location of the coronal slice show in the top row of images 302, 306, 310.

Images 302 and 304 display the initial MRI image. Images 306 and 308 show the image after a Sobel operator has been applied in the vertical direction.

The diaphragm is identified in FIG. 2 by first thresholding the magnitude or length of the gradient vector. Thresholding is defined as the process of marking individual pixels in an image as object pixels if their value is greater than a specified threshold value, and the scalar product between the normalized gradient and a pre-defined direction is calculated. The pre-defined direction coincides with the z-direction. The identification of the right wall of the pericardium is not demonstrated in FIG. 2, but can be identified using the same method, except that the predefined direction is in the x-direction. Similarly left wall of the pericardium is identified with the predefined direction that lies in a tilted x-z plane. The edge detection in the tilted x-z plane is obtained by weighting the x and the z voxels according to the tilt. For example, if the desired direction is (x=0.5, z=0.866), then the weighting uses these numbers as weights.

The bright pixels 318 shown in images 306, 308, 310, and 312 show where the magnitude of the gradient vector is above a specified value and the scalar product of the z-direction and the normalized gradient is above a second value. Images 310 and 312 show the location of a mesh 320 after it has been positioned with the first segmentation module. The mesh 320 shown in images 310 and 312 is the same, but viewed from different slices. The initial position of the mesh was determined using connected component clustering. This is an embodiment of the anatomical landmark module. The initial position of the mesh was then used by an embodiment of the first segmentation module to adjust the position of the mesh. Visible in images are bright pixels 318 which are not located near the mesh. These bright pixels do not belong to the highest rated cluster, as determined by the connected component analysis, and are therefore disregarded. The images shown in FIG. 3 only show the positioning in the z direction. In this embodiment of the invention, the process is repeated in the x direction to position a shape constrained deformable model on the right wall of the pericardium and in a tilted x-z plane to position a shape constrained deformable model on the left wall of the pericardium.

Figure 4:
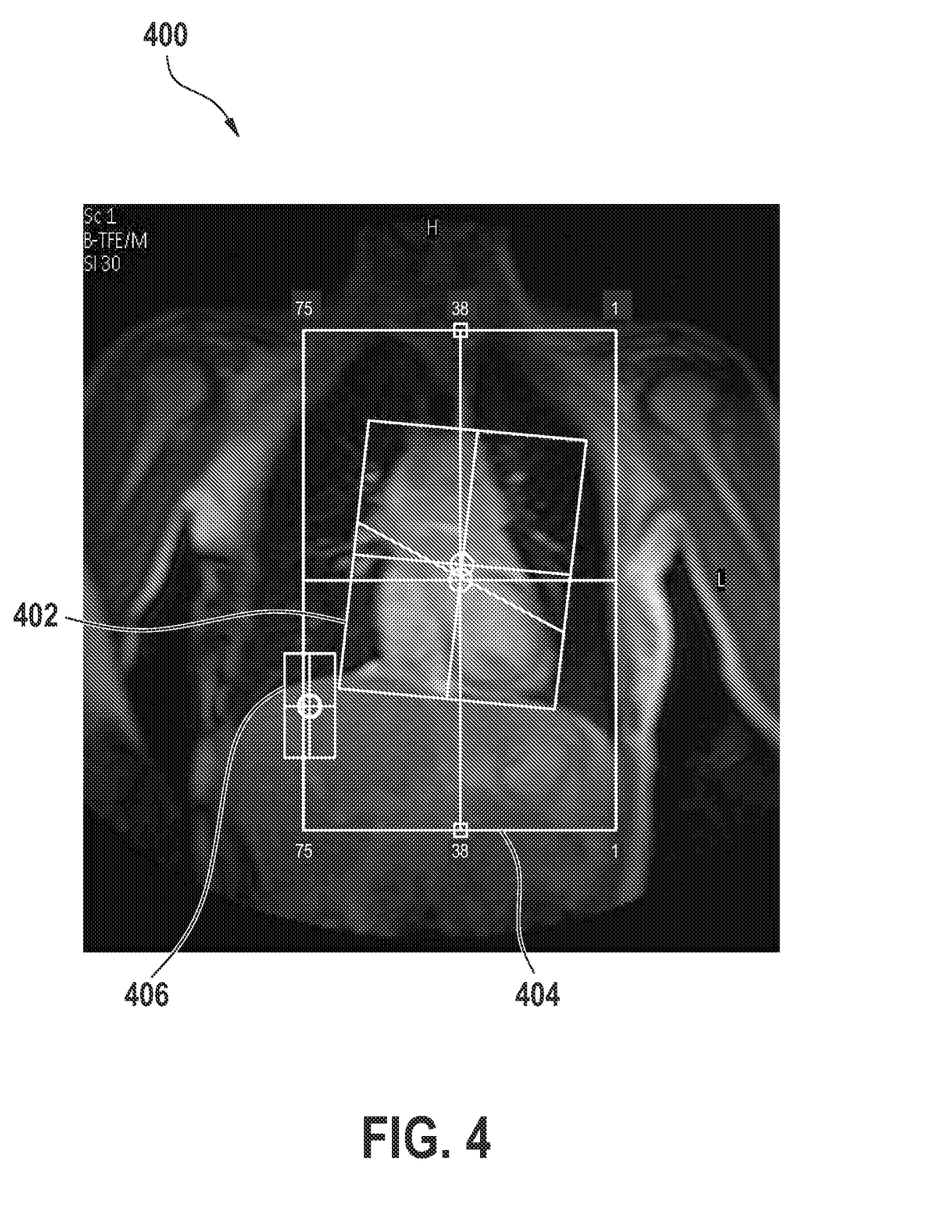
FIG. 4 is a coronal MRI image that shows the placement of volumes of interest.

FIG. 4 is used to illustrate an example of an embodiment of the invention. FIG. 4 shows the location of volumes of interest that have been placed by the first pattern recognition module 140. This figure shows the location of the shim volume 402, the stack volume 404, and the navigator beam volume 406. For some MRI examinations, a sequential approach is used to plan the clinical MRI image. For example, in heart-examinations, two survey images are needed to automatically plan the diagnostics scans. The first MRI scan is a low resolution multiple 2D Multi-Stack survey of the body and is used to locate the heart and diaphragm. This takes about 12 seconds to complete. This produces the multiple 2D MRI image. The second MRI scan is a high resolution 3D-survey which is planned on the heart using the information from the first survey. This survey takes about 60 seconds. The planning for this survey is shown in FIG. 4. The projection of the 3D volume into the plane of the MRI slice 400 is indicated by the box labeled 404. The box labeled 402 shows the location of the shim volume. The box labeled 406 is the navigator beam volume. The navigator beam is used to determine the position of the diaphragm when the data for a particular MRI image was acquired and is used to compensate for the effect of the patient breathing. The 3D-survey provides the information to plan the diagnostic scans. This includes information such as the location of the heart anatomy and the orientation of anatomy.

Cardiac-MR examinations are difficult to execute, and manual planning is difficult and time-consuming. Automated sequential scan planning would reduce the time necessary to perform a cardiac MRI examination. Another application that would benefit from sequential scan planning is contiguous moving bed imaging. An example of contiguous moving bed imaging would be first acquiring MRI data while the patient is resting on a bed that is moving into the MRI scanner. The bed is stopped when the anatomy of interest (e.g. the liver) is found. Then a MRI image with specific geometry is planned automatically using pattern recognition software, and acquired to focus on the liver. From this second survey information could be extracted to plan a dedicated clinical MRI image. Moving bed imaging can be used for any abdominal organ.

Example

Improvements to COMBI

An example of how embodiments of the invention can be integrated with Continuous Moving Bed Imaging (COMBI) or multi-station imaging allow sequential scan planning is detailed. Embodiments are able to automatically and consistently satisfy basic assumptions on patient positioning for clinical MRI examinations. The sequential approach to automated scan planning allows improvements in workflow, as well as reliability, consistency and quality for the acquisition of clinical images.

Patient preparation is an important step in the workflow for every MRI examination. Among many other duties, the operator decides on positioning of the patient (head first vs. feet first, prone vs. supine) and adjusts the table position such that the anatomy to be examined is in the central sensitive volume of the magnet.

For correct table adjustment, the operator requires profound anatomical knowledge as well as knowledge about site-specific, protocol dependent preferences. A device called a light visor indicates a fixed reference point with respect to the central sensitive volume of the MRI system, which facilitates table adjustment. However, this also adds to the required knowledge for correct use in order to position the patient consistently with respect to protocol guidelines and the anatomy to be imaged.

Performance of current scan planning technology is dependent on correct positioning of the patient. Although available scan planning technology is able to deal with anatomical variability, pathologies, and positional variability, it still assumes that certain anatomical structures be within the FOV of the survey on which anatomy recognition and planning of clinical volumes are carried out. Incorrect patient positioning may lead to violation of this basic assumption. It is thus one cause of automated scan planning failure.

COMBI is an imaging technique for MRI systems, which acquires images while the table, on which the patient is positioned, is steadily moving. It is thus able to generate image volumes with a very large FOV similar to prior existing multi-station image volumes. The multi-station approach acquires several image volumes of different regions, moving from one station to the next in-between, such that all volumes together cover the complete FOV, having at the same time as little overlap as possible.

The COMBI technique has been in place for several years with exemplary applications to whole-body imaging (Aldefeld, B et al.: "Continuously moving table 3D MRI with lateral frequency-encoding direction", Magn. Reson. Med. 55(5)), 1210-1216, 2006, as well as whole-body imaging in combination with water-fat separation for fat fraction assessment (Boernert, P et al.: "Whole-body 3D water/fat resolved continuously moving table imaging", J. Magn. Reson. Imag. 25(3), 660-665, 2007).

The capability of COMBI or multi-station for acquiring image volumes with extremely large FOV is thus a key enabling factor for workflow improvements that manifest in a sequential approach to automated scan planning technology.

Using the COMBI or multi-station technique in the framework of a sequential scan planning approach, the basic assumption on the FOV for the survey can be automatically and consistently satisfied without operator intervention. This technique is particularly applicable for imaging the liver, as it is an organ for which position, size and shape are not obviously determined from outside the patient.

An embodiment of the application proceeds as follows:

Patient preparation would be as usual with the difference that only very rough table adjustment is done. In a scenario, where the first survey acquired is a whole-body survey, no table adjustment has to be performed. In this case, the basic assumption for the first stage of the sequential approach is that no part of the patient is within the central sensitive volume of the MRI system.

Using the COMBI technique or multi-station imaging is performed together with a dedicated sequence. A first survey with a very large FOV (e.g. whole-body) is acquired. The sequence is designed such that it gives good contrast within the region, where the anatomy that is to be clinically imaged is situated (e.g. upper abdominal region).

a) Using image processing techniques the organ (e.g. the liver) and its surrounding region are located within the first survey, and landmarks are extracted accordingly. It has been shown, that image processing for detecting the liver in whole-body surveys can be done in real-time with respect to the traveling speed of the table (Dries, S et al.: "MR Travel to Scan Image Processing for Real-Time Liver Identification", Proc. ISMRM 16, p. 3170, 2008 (cited as Dries)), such that the survey can be aborted once the organ to be imaged clinically and its surrounding region have been detected, thus saving acquisition time.

b) Based on the extracted landmarks the MRI system then automatically plans the position, orientation and extent of a second survey that focuses on the region of the anatomy that is to be imaged clinically (e.g. the upper abdomen for liver imaging).

Using the planning data from the previous step, a second survey is acquired using a dedicated sequence. This second survey serves the same purpose and will therefore have similar image quality characteristics as the single survey that is acquired in a conventional approach, where initially the operator has manually adjusted the position of the table.

a) Using image processing techniques the organ to be imaged clinically (e.g. the liver) is detected accurately in the second survey, and landmarks are extracted accordingly.

b) Based on the extracted landmarks the MRI system then automatically plans position, orientation and extent of the clinical images.

The clinical images are acquired.

The process described above constitutes improvements for MRI examinations in the following respects:

Workflow:

The patient preparation is shortened, errors in patient positioning or incorrect use of the light visor by the operator are eliminated.

Consistency/Reliability:

positional consistency of the second survey is improved in comparison with the single manual survey, and thus reliability of automated scan planning technology on this survey is also improved as the basic assumptions on the FOV are automatically satisfied.

Quality:

Besides the above-mentioned benefits, the sequential approach can yield additional information on patient peculiarities such as indications on expected tissue response for the subsequent sequences to be acquired. It is a means for adjusting the following sequences as to obtaining acceptable contrasts, thus reducing the probability of the need for repeating a sequence due to unacceptable contrast or mispositioning.

Example

Acquisition of a Set of Degenerative Intervertebral Disk Images

This example demonstrates an embodiment of the invention where an automated survey scan is performed, which is then followed by two sequential, automatically acquired clinical MRI images. The first clinical MRI image is used for planning the second clinical MRI image. This application details the fully automated acquisition of degenerative intervertebral discs. For example the discs can be in the lower spine. This is clinically relevant since this abnormality can cause many problems such as pain in the lower back to complete hernias. Due to the growing population of elderly and overweight people this type of investigation is becoming more important. One or more discs may have pathological changes, and these may be located anywhere in the vertebral column.

The classic method to acquire clinical images with MRI involves several steps. First a survey scan is performed. Using this scan the operator manually places several geometry elements and acquires a high resolution sagittal T2 image. From this image the operator identifies the degenerative discs (if present). This relies on operator expertise and attention at the time of the scan. If the operator is distracted, the pathology can be missed. In some cases, a radiologist may be needed to specify further imaging. This disrupts the physician's schedule and work flow. Then each selected disc is manually planned and a clinical, axial, high resolution T2 image is acquired containing the discs (in stacks). Multiple stacks are preferable to a 3D acquisition, in order to obtain optimal resolution at the correct angulation for each disc in turn, however each stack takes additional scan time. It is usual therefore to only acquire stacks on the discs which show pathological changes.

Automated sequential planning can relieve the operator from the task of planning multiple geometry elements, selecting a sub area of the spine, selecting clinically interesting intervertebral discs, and acquiring them with the correct orientation.

The method consists of 5 steps, from which three are MR acquisitions and two are processing steps. Each processing step is used to automatically extract information from the preceding image acquisition, such that it enables the automatic execution of the next acquisition with clinically relevant geometries and orientations.

In detail, an embodiment of the method consists of the following:

Acquiring a low resolution, high FOV MRI image of the total spine. This could be a multi-station acquisition from which the two stations are 'glued' together automatically. In general this acquisition would be of a survey type with low spatial resolution, in order to save time. However, the survey contains enough information to automatically extract relevant features with a computer with which it is possible to plan the following scan automatically.

Localizing the intervertebral discs with a processing algorithm that is operable for roughly localizing the intervertebral discs, annotating them, and locating landmarks on the intervertebral discs. With a second algorithm the set of landmarks is matched with a database of landmarks and geometries, and from this matching the preferred orientation of the spine geometry of this case can be calculated. For each intervertebral disc or subset of discs a preferred geometry can now be calculated. This type of processing is documented in the literature (International Society for Magnetic Resonance in Medicine 2008, Medical Image Computing and Computer-Assisted Intervention 2007).

Acquiring a high resolution sagittal T2 image using the calculated spine geometries from step B. This is done automatically on basis of the clinically relevant area. For example, the lumber part of the spine, containing L1-L5. This image can be used for clinical inspection. However, it can also be used as a 'survey' for a computer algorithm which estimates if the intervertebral discs between T12 and S1 are degenerative or not. More specifically, the algorithm can consist of a segmentation algorithm that estimates the surface of each intervertebral disk. Then, using a criterion based on shape and/or signal contrast, a decision for each disc can be made whether it is degenerative or not. Spine segmentation algorithms are well known (see Medical Image Computing and Computer-Assisted Intervention 2008 for example) and can easily be extended for intervertebral discs. Especially, since the position and rough orientation of each disc is already known from B. Useful references are:

Violas, E. Estivalezes, J. Briot, J. Sales de Gauzy, P. Swider, Magn. Reson. Imaging, 25, pp. 386-391, Jill P. G. Urban, C. Peter Winlove, J. Mag. Reson. Imaging, 25 pp. 419-432 (2007), and M. S, Saifuddin A. Clin Radiol., 54, pp. 703-23 (1999).

Acquiring a stack of images for each disc. When it is known which intervertebral discs are degenerative, an acquisition can be setup containing a stack of images for each disc. Since the preferred orientation of each disc is known this can be taken into account. Each stack is a clinically relevant image for a degenerative disc.

Example

Clinical Wrist Imaging

This example demonstrates an embodiment of the invention where two sequential, automated survey scans are performed and are used to automatically plan the acquisition of clinical MRI images. This example details a fully automated acquisition of clinical MRI images of the wrist. This is clinically relevant since the positioning of the wrist using the light visor is time consuming and error prone. Because of these difficulties, a first survey is often acquired only to locate the wrist. Then, a second survey that zooms in on the wrist region is acquired which is used for the actual planning of clinical images.

Automated sequential planning relieves the operator of the task of manually zooming to the correct wrist location and of planning the subsequent clinical image. The first survey is automatically processed to locate the wrist. A second zoomed survey is then used to plan the first clinical images.

In detail, an embodiment of the method consists of the following:

Acquiring a first survey scan of the wrist region. This is a large field of view survey scan.

Processing the first survey scan in order to locate the wrist. This can be performed using masking operation in order to localize the anatomy or a more specialized processing that already reveals detail in the anatomy.

Acquiring a second, localized survey of the wrist.

Processing the second survey to obtain planning data for planning a clinical MRI image.

Acquire the clinical MRI image.

LIST OF REFERENCE NUMERALS

| | |
|---|---|
| 100 | MRI Scanner |
| 102 | Gradient Coil Control Unit |
| 104 | Gradient Coils |
| 106 | Magnet Control Unit |
| 108 | Magnet |
| 110 | Patient Support |
| 112 | Patient |
| 114 | RF Transceiver Coil Control Unit |
| 116 | Phased Array Transceiver Coil |
| 120 | Control System |
| 122 | Hardware Interface |
| 124 | Microprocessor or Computer |
| 126 | User Interface |
| 128 | Computer Program Product |
| 130 | 3D volume module |
| 132 | Edge detection module |
| 134 | Anatomical landmark module |
| 136 | First segmentation module |
| 138 | Second segmentation module |
| 140 | First pattern recognition module |
| 142 | Second pattern recognition module |
| 170 | Dialogue box |
| 172 | Region for selecting action |
| 174 | Button to accept suggested scan parameters |
| 176 | Button to redo suggested scan parameters |
| 178 | Button to allow operator to adjust scan parameters |
| 180 | Region to display suggested scan parameters |
| 182 | MRI image |
| 184 | Graphical display of planning data |
| 200 | Acquire multi 2D image |
| 202 | Construct 3D volume |
| 204 | Edge detection |
| 206 | Identify anatomical landmarks |
| 208 | Segment 3D volume |
| 210 | Determine volumes of interest |
| 212 | Acquire preliminary MRI images |
| 214 | Segment preliminary MRI images |
| 216 | Plan clinical MRI images |
| 218 | Acquire clinical MRI images |
| 302 | Coronal MRI image through the heart |
| 304 | Sagittal MRI image showing diaphragm |
| 306 | Image 302 processed with Sobel operator |
| 308 | Image 304 processed with Sobel operator |
| 310 | Image 306 showing final placement of mesh on diaphragm |
| 312 | Image 308 sowing final placement of mesh on diaphragm |
| 314 | Location of sagittal plane show in images 304, 308, and 312 |
| 316 | Location of coronal plane shown in images 302, 306, and 310 |
| 318 | Bright pixel |
| 320 | Mesh |
| 400 | MRI image |
| 402 | Shim volume |
| 404 | Survey stack |
| 406 | Navigator volume |

The invention claimed is:

1. A method of acquiring at least one clinical MRI image of a subject comprising the following steps:

acquiring a first survey image with a first field of view, the first survey image having a first spatial resolution, locating a first region of interest and at least one anatomical landmark in the first survey image, determining the position and the orientation of the first region of interest using the anatomical landmark, the position and the orientation of the first region being used for planning a second survey image, acquiring the second survey image with a second field of view, the second survey image having a second spatial resolution, the second spatial resolution being higher than the first spatial resolution, generating a geometry planning for the anatomical region of interest using the second survey image, acquiring a diagnostic image of the anatomical region of interest using the geometry planning.

2. The method of claim 1, wherein the step of acquiring a first survey image with a first field of view comprises:

acquiring a multiple 2D MRI image of the subject using a preselected parameter set, and wherein the step of locating a first region of interest and at least one anatomical landmarks in the first survey image comprises:

constructing a 3D volume from the multiple 2D MRI image with a 3D volume module, detecting a set of edges in the 3D volume with an edge detection module, identifying one or more anatomical landmarks in the 3D volume with an anatomical landmark module using the set of edges, segmenting the 3D volume automatically by using the one or more anatomical landmarks for fitting a first shape constrained deformable model using a first segmentation module, and wherein the step of determining the position and the orientation of the first region of interest using the anatomical landmarks comprises:

determining a volume of interest within the segmented 3D volume needed for a subsequent acquisition of MRI data with a first pattern recognition module, and wherein the step of acquiring the second survey image with a second field of view comprises:

acquiring one or more preliminary MRI images of the volume of interest, and wherein the step of generating a geometry planning for the anatomical region of interest using the second survey image comprises:

segmenting the one or more preliminary MRI images with a second shape constrained deformable model using a second segmentation module, generating a set of planning data for planning a clinical MRI image with a second pattern recognition module using the segmented one or more preliminary MRI images, and wherein the step of acquiring a diagnostic image of the anatomical region of interest using the geometry planning comprises:

Acquiring one or more clinical MRI images using the set of planning data.

3. The method of claim 2, wherein at least one of: the multiple 2D image, the 3D volume, the set of edges, the one or more anatomical landmarks, the segmented 3D volume, the volume of interest, the one or more preliminary MRI images, and the one or more preliminary segmented MRI images is stored in a computer data storage device for reuse for generating a second set of planning data for planning a clinical MRI image.

4. The method of claim 2, wherein the first pattern recognition module determines multiple volumes of interest, wherein first pattern recognition module selects each volume of interest to be in either a first subset, a second subset, or a third subset, wherein the one or more MRI images of each element of the first subset and of each element of the third subset is acquired, wherein each element of the second subset and each element of the third subset has an MRI technique applied to it selected from the group of consisting of: magnetization preparation pulses, fat suppression pulses, Arterial Spin Labeling (ASL), Regional Saturation Technique (REST), Spectral Presaturation Inversion Recovery (SPIR), Inversion, Navigator beam, B1 shimming, and B0 shimming, and wherein MRI data acquired from all the volumes of interest is used by the second pattern recognition module for generating the planning data.

5. The method of claim 2, wherein the first pattern recognition module and the second pattern recognition module are trained pattern recognition modules.

6. The method of claim 2, wherein the anatomical recognition module is an implementation of a feature identification algorithm.

7. A non-transitory computer program product comprising a set of computer executable instructions for performing the method of claim 1.

8. An apparatus for acquiring clinical MRI data of a subject comprising:

means for acquiring a first survey image with a first field of view, the first survey image having a first spatial resolution, means for locating a first region of interest and at least one anatomical landmarks in the first survey image, means for determining the position and the orientation of the first region of interest using the anatomical landmarks, the position and the orientation of the first region being used for planning a second survey image, means for acquiring the second survey image with a second field of view, the second survey image having a second spatial resolution, the second spatial resolution being higher than the first spatial resolution, means for generating a geometry planning for the anatomical region of interest using the second survey image, means for acquiring a diagnostic image of the anatomical region of interest using the geometry planning.

9. The apparatus of claim 8, wherein the means for acquiring a first survey image with a first field of view comprise:

means for acquiring a multiple 2D MRI image of the subject using a preselected parameter set, and wherein the means for locating a first region of interest and at least one anatomical landmarks in the first survey image comprise:

means for constructing a 3D volume from the multiple 2D MRI image with a 3D volume module, means for detecting a set of edges in the 3D volume with an edge detection module, means for identifying one or more anatomical landmarks in the 3D volume with an anatomical landmark module, means for segmenting the 3D volume image automatically by using the one or more anatomical landmarks for fitting a shape constrained deformable model using a first segmentation module, and wherein the means for determining the position and the orientation of the first region of interest using the anatomical landmarks comprise:

means for identifying one or more anatomical landmarks in the 3D volume with an anatomical landmark module, means for segmenting the 3D volume image automatically by using the one or more anatomical landmarks for fitting a shape constrained deformable model using a first segmentation module, means for determining a volume of interest within the segmented 3D volume needed for a subsequent acquisition of MRI data with a first pattern recognition module and wherein the means for acquiring the second survey image with a second field of view comprise:

means for acquiring one or more preliminary MRI images of the volume of interest, and wherein the means for generating a geometry planning for the anatomical region of interest using the second survey image comprise:
  Means for segmenting the one or more preliminary MRI images with a shape constrained deformable model using a second segmentation module,
  means for generating a set of planning data for planning a clinical MRI image with a second pattern recognition module using the segmented one or more preliminary MRI images,
and wherein the means for acquiring a diagnostic image of the anatomical region of interest using the geometry planning comprise:
  means for acquiring one or more clinical MRI images using the set of planning data.

10. The apparatus of claim 9, being further operable to store at least one of: the multiple 2D image, the 3D volume, the set of edges, the one or more anatomical landmarks, the segmented 3D volume, the volume of interest, the one or more preliminary MRI images, and the one or more preliminary segmented MRI images is stored in a computer data storage device for reuse for generating a second set of planning data for planning a clinical MRI image.

11. The apparatus of claim 9, wherein the first pattern recognition module and the second pattern recognition module are trained pattern recognition modules.

12. The apparatus of claim 9, wherein the anatomical recognition module is an implementation of a feature identification algorithm.

13. The apparatus of claim 9, wherein the first pattern recognition module is operable to determine multiple volumes of interest, wherein the first pattern recognition module is operable for selecting each volume of interest to be in either a first subset, a second subset, or a third subset, wherein the apparatus is operable to acquire one or more MRI images of each element of the first subset and of each element of the third subset, wherein the apparatus is operable to apply an MRI technique selected from the group of consisting of: magnetization preparation pulses, fat suppression pulses, Arterial Spin Labeling (ASL), Regional Saturation Technique (REST), Spectral Presaturation Inversion Recovery (SPIR), Inversion, Navigator beam, B1 shimming, and B0 shimming to each element of the second subset and to each element of the third subset, and wherein MRI data acquired from all the volumes of interest is used by the second pattern recognition module for generating the planning data.

14. The apparatus of claim 9, further comprised of a user interface which is operable to display the set of planning data graphically before the clinical MRI scan is acquired, and wherein the user interface has an input means for inputting an operator choice comprised of: accepting or rejecting the set of planning data, wherein in the case of acceptance the acquisition of the one or more clinical MRI images is performed, and wherein in case of rejection the user interface displays a set of rejection data, wherein the rejection data is comprised of at least one of: the multiple 2D image, the 3D volume, the edges, the anatomical landmarks, the segmented 3D volume, the volume of interest, the one or more preliminary MRI images, and the one or more preliminary segmented MRI images and the set of planning data.

15. The apparatus of claim 14, wherein the user interface is operable to receive a manual modification of the set of rejection data, wherein the modified rejection data is used for generating a modified set of planning data, wherein one or more clinical MRI images are acquired using the modified set of planning data.

* * * * *